US006271693B1

(12) United States Patent
Shi et al.

(10) Patent No.: US 6,271,693 B1
(45) Date of Patent: Aug. 7, 2001

(54) MULTI-FUNCTION SWITCHED-CURRENT MAGNITUDE SORTER

(75) Inventors: Bingxue Shi; Gu Lin, both of Beijing (CN)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 08/989,621

(22) Filed: Dec. 12, 1997

(51) Int. Cl.[7] ..... H03K 17/00

(52) U.S. Cl. ..... 327/99; 327/64; 327/58; 707/7

(58) Field of Search ..... 327/19, 63, 64, 327/99, 296, 403, 404, 58–62, 71; 708/671; 707/7; 395/898

(56) References Cited

U.S. PATENT DOCUMENTS 4,479,241 * 10/1984 Buckley ..... 382/159
4,498,040 * 2/1985 Tatsushi et al. ..... 327/63
4,685,128 * 8/1987 Powel ..... 379/272
4,890,013 * 12/1989 Arcus ..... 327/64
5,410,689 * 4/1995 Togo et al. ..... 707/7
5,535,384 * 7/1996 Kasahara ..... 707/7
5,682,320 * 10/1997 Khouja et al. ..... 364/489
5,703,503 * 12/1997 Miyamoto et al. ..... 327/58
5,793,655 * 8/1998 Harlap et al. ..... 364/715.012
5,838,317 * 11/1998 Bolnick et al. ..... 707/7
5,855,016 * 12/1998 Edem et al. ..... 707/7
5,873,001 * 2/1999 Brinker et al. ..... 395/898
6,118,307 * 9/2000 Shi et al. ..... 327/58

* cited by examiner

*Primary Examiner*—Terry D. Cunningham
*Assistant Examiner*—Long Nguyen
(74) *Attorney, Agent, or Firm*—Rabin & Champagne, P.C.

(57) ABSTRACT

A signal sorter for magnitude sorting among a number of signals is disclosed that allows for magnitude sorting of a number of signals in an ascending or descending ordered manner governed by the clock controlling signals. The sorter can generate sorted outputs fast enough for real-time applications and has a circuit structure suitable for implementation as integrated circuit devices. The sorter has a signal input section, maximum-deriving section, a feedback control and voltage output section and a sorted output section. All four sections are controlled by a set of timing clock input signals to manipulate the signal magnitude sorting.

5 Claims, 6 Drawing Sheets

MULTI-FUNCTION SWITCHED-CURRENT MAGNITUDE SORTER

BACKGROUND OF THE INVENTION

1. Field of the Invention

This invention relates in general to magnitude sorting among a number of signals. In particular, this invention relates to magnitude sorting of a number of signals in an ascending or descending ordered manner governed by the clock controlling signals.

2. Description of Related Art

Ordering of magnitudes for large and small among a number of electrical signals having different measured magnitudes is necessary among many digital applications. One method of magnitude sorting relies on software schemes that are conducted on number processing devices such as digital computers. This is not suitable for real-time processing of signals as the computer program embodying the software scheme cannot obtain its sorted result until after the conclusion of the program processing. A time-lagged result of such software-based sorting schemes has also placed limitations to possible areas of application of this category of magnitude sorting.

On the other hand, however, current hardware sorter circuitry can only differentiate either the largest or the smallest, or both, of the compared signals among the signals. To sort the signals in an orderly ascending or descending sequence, these conventional sorters must perform a number of subsequent sorting sessions to subsequently pick out the largest, or smallest, signal in a processed pool of the signals. Within these subsequent sessions the identified largest or smallest signal is removed from the next processed pool. This hardware sorting scheme has a circuitry scale that is substantially proportional to the number of processed signals. In other words, the larger the total number of sorted signals, the larger the scale of the sorter circuitry. Meanwhile, the more the sorted signals, the longer the delay time before the final sorted result can be obtained. This is obvious since the more the sorted signals, the more the maximum- or the minimum-magnitude signal-identifying sessions will be required. Thus, such hardware sorters, are by no means suitable for real-time applications as well.

SUMMARY OF THE INVENTION

It is therefore an object of the invention to provide a magnitude sorter that is capable of generating sorted outputs that are arranged in the ascending or descending ordered manner for a number of input signals based on the magnitudes thereof.

It is another object of the invention to provide a magnitude sorter for generating sorted outputs for a number of input signals that can process fast enough for real-time applications.

It is yet another object of the invention to provide a magnitude sorter for generating sorted outputs of a number of input signals that has a circuit structure suitable for implementation as integrated circuit devices.

The present invention achieves the above-identified objects by providing a magnitude sorter circuit apparatus for sorting to output a number of input signals into an ascending or descending ordered manner based on the magnitude of the input signals. The sorter apparatus has a signal input section that includes a number of signal input unit circuits, each, of the signal input unit circuits has an input for receiving a corresponding one of the input signals and generating an output signal, and further has a feedback input for receiving a feedback signal; and each of the signal input unit circuits is driven by a first clock control signal. A maximum-deriving section includes a number of maximizing unit circuits, each of the maximizing unit circuits receives the output signal output by the corresponding signal input unit circuit, and generates an output signal that is connected together with those generated by other maximizing unit circuits to form the maximized output of the maximum-deriving section. A feedback control and voltage output section includes a number of feedback control/voltage output unit circuits, each of the feedback control/voltage output unit circuits receives the output signal output by the corresponding signal input unit circuit, and generates a feedback control signal for feedback into the feedback input of the corresponding signal input unit circuit, and each of the feedback control/voltage output unit circuits is driven by a second clock control signal, and each has a first and second input voltage signals. A sorted output sections has an input for receiving the maximized output of the maximum-deriving section and a number of timing clock inputs each receiving a corresponding one of the timing clock control signals, and has a number of sorted outputs, the sorted output section generates the sorted output signals at the sorted outputs in the sorted ascending or descending ordered manner controlled by the timing clock control signals.

BRIEF DESCRIPTION OF THE DRAWINGS

Other objects, features, and advantages of the present invention will become apparent by way of the following detailed description of the preferred but non-limiting embodiments. The description is made with, reference to the accompanying drawings in which.

DESCRIPTION OF THE PREFERRED EMBODIMENT

Figure 1:
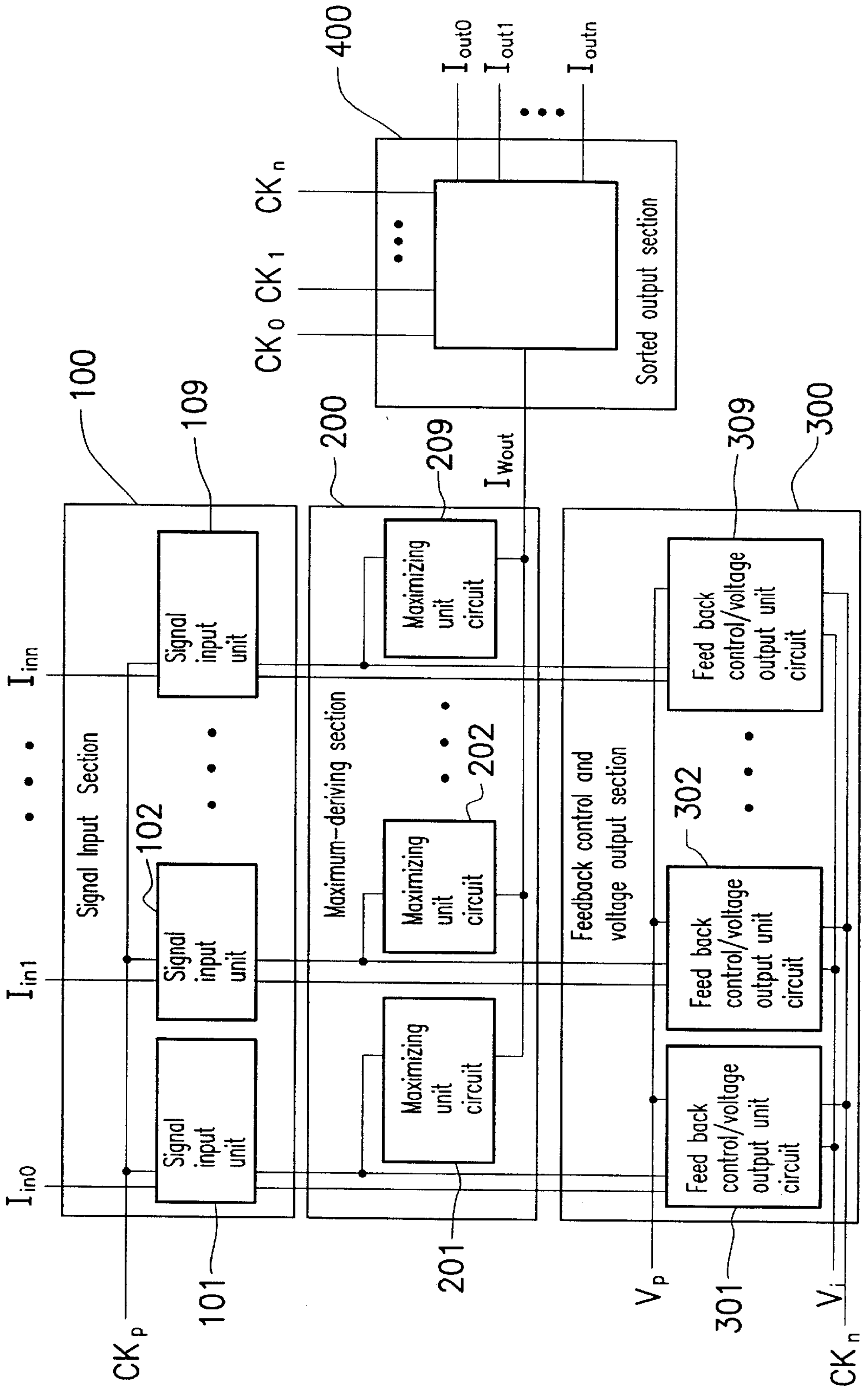
FIG. 1 is a block diagram showing the circuitry configuration of the switched-current magnitude sorter in accordance with a preferred embodiment of the invention.

FIG. 1 is a block diagram showing the circuitry configuration of the switched-current magnitude sorter in accordance with a preferred embodiment of the invention. As is illustrated in the block diagram, the magnitude sorter of the invention has a circuitry configuration generally includes four functional sections. They are the signal input section 100, the maximum-deriving section 200, the feedback control and voltage output section 300, and the sorted output section 400. Three of the four constituent sections, namely the signal input section 100, the maximum-deriving section 200 and the feedback control and voltage output section 300 are connected in a cascade and feedback manner, with the fourth section, i.e., the sorted output section 400 receiving an input signal from the combination of the other three.

Each of sections, 100, 200 and 300 includes, a multiple number of component circuits. For example, in the embodiment depicted in the block diagram of the magnitude sorter of the invention of FIG. 1, the signal input section 100 is consisted of an array of N+1 signal input units 101, 102, and 109. As will be described in further detail later, each of these input units serves to receive on of the multiple number of input signals $I_{in_0}$, $I_{in_1}$, and $I_{in_2}$, for processing and sorting in the sorter of FIG. 1. Similarly, the maximum-deriving section 200 includes an array of N+1 WTA (winner takes-all) maximizing unit circuits 201, 202, and 209, and the feedback control and voltage output section 300 has an array of N+1 unit circuits 301, 302 and 309. Basically, the total number of unit circuits N+1 in each of the array of the three sections 100, 200 and 300 is also the total number of input signals that can be sorted in the magnitude sorter depicted in the block diagram of FIG. 1.

Essentially, each unit circuits in the three sections is connected in cascade to a corresponding one in the other two sections to form a feedback loop as mentioned above. For example, the first signal input unit circuit 101 in the signal input section 100 is connected to the first maximizing unit circuit 201 in the maximum-deriving section 200 in one of its signal lines, and then also connected via the same signal line to the first feedback control/voltage output unit circuit 301. The first feedback control/voltage output unit circuit 301 provides a feedback control signal to the first signal input unit circuit 101 via a signal line between the two as can be seen in the drawing. Similar circuitry connection arrangements are also applied to the cascades of unit circuits 102, 202 and 302 as well as of 109, 209 and 309.

In the transverse direction, unit circuits in each of the three sections 100, 200 and 300 are also tied together by control signals in their respective arrays. For example, all the signal input unit circuits 101, 102 and 109 and all the feedback control/voltage output unit circuits 301, 302 and 309 are driven by the same clock signal $CK_p$. On the other hand, all the maximizing unit circuits 201, 202 and 209 in the section 200 have their outputs tied together to provide the single output signal $I_{vf_{out}}$ that serves as the input the fourth section of the magnitude sorter, namely the sorted output section 400.

The sorted output section 400 further receives a multiple number of input clock signals $CK_0$, $CK_1$, . . . and $CK_n$. Based on these input clock signals and the input signal $IW_{out}$, the sorted output section 400 produces an array of output signals $I_{out_0}$ , $I_{out_1}$ and $I_{out_n}$, which are signals arranged in a sorted array with magnitudes orderly arranged in either the ascending or descending direction.

Figure 2:
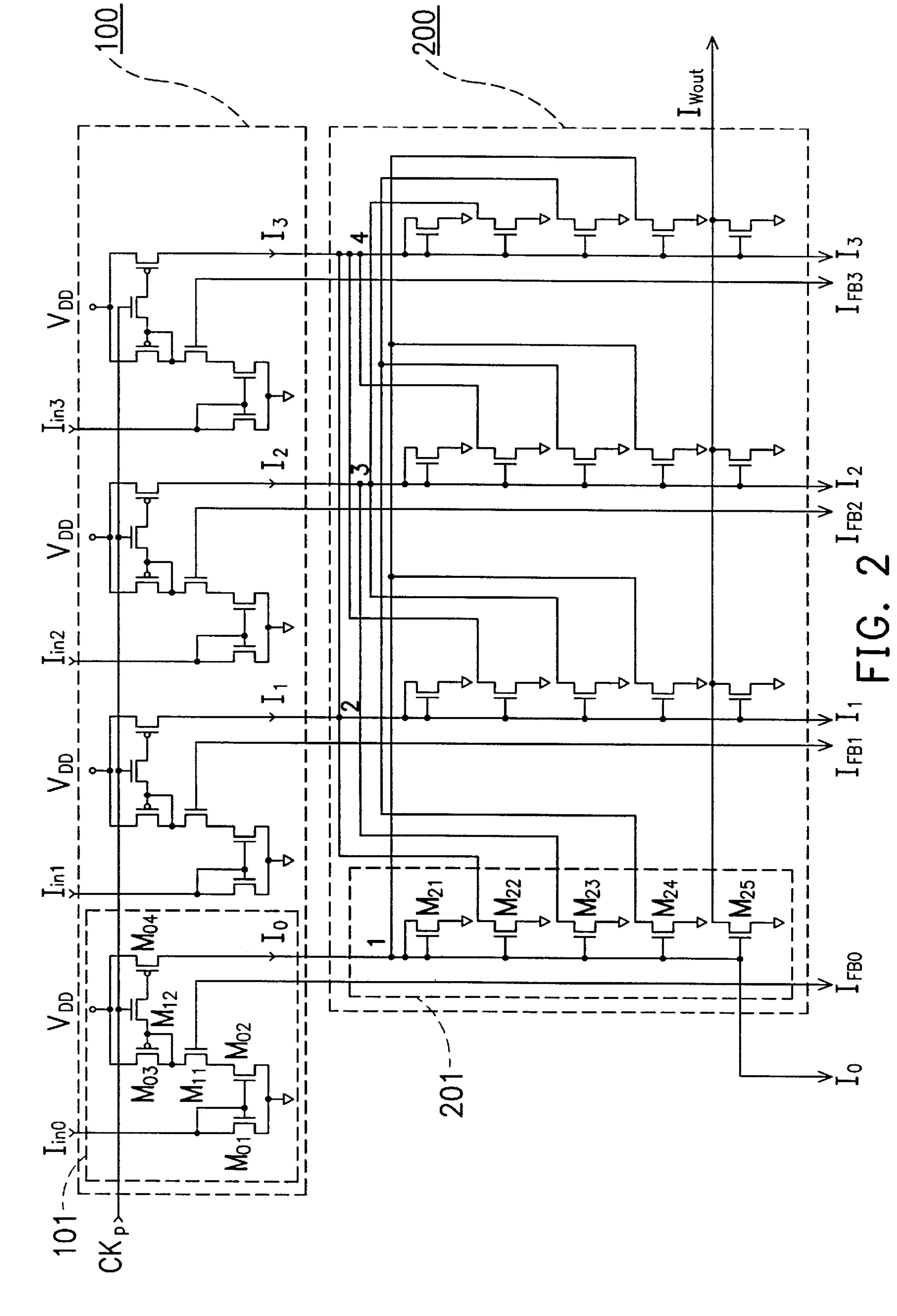
FIG. 2 is the schematic diagram showing the signal input section and the maximum-deriving section of the switched-current magnitude sorter of FIG. 1.

FIG. 2 is the schematic diagram showing the signal input section 100 and the maximum-deriving section 200 of the switched-current magnitude sorter outlined in the block diagram of FIG. 1. In this depicted example, the signal input section 100 includes only four identical input signal input unit circuits 101, 102, 103 and 104 in order to process the sorting of four input signals $I_{in_0}$, $I_{in_1}$, $I_{in_2}$ and $I_{in_3}$, as can be seen in the drawing. Of course, as persons skilled in the art may well appreciate, signal input unit circuits more or less than four can also be possible. The total number depends on the need, Each of signal input unit circuits 101, 102, 103 and 104 is fed with its respective current $I_{in_1}$ ($0 \leqq i \leqq 3$). These are the signals to be sorted in terms of the current magnitudes thereof. Since all four signal input unit circuits 101, 102, 103 and 104 have virtually the same circuit configuration, therefore only one of them will be examined. Only the first signal input unit circuit 101 in the block diagram of FIG. 1 will be described which has the detailed circuitry configuration shown in FIG. 2.

With reference to FIG. 2, it can be seen that the signal input unit circuit 101 is consisted of a number of MOS transistors. Transistor $M_{01}$ has one of its source/drain terminals connected to system ground potential, and the other receiving one of the input signal $I_{in_0}$ in this signal input unit circuit 101, to be sorted in the magnitude sorter. Transistor $M_{02}$, is connected in series with another two transistors $M_{11}$ and $M_{03}$, and the series chain of these three transistors is then tied between the ground potential and the power supply plane of the system, identified by the symbol $V_{DD}$. Gate terminal or transistor $M_{01}$ and $M_{02}$ are tied together and further to the input signal $I_{in_0}$.

Gate terminal of transistor $M_{03}$ is connected to the joining source/drain terminal between transistors $M_{11}$ and $M_{03}$ itself. Gate terminal of transistor $M_{03}$ is further connected to the gate terminal of another transistor $M_{04}$ across the two source/drain terminals of another transistor $M_{12}$. One of the source/drain terminals of transistor $M_{04}$ is tied to system power supply potential $V_{DD}$. Gate of transistor $M_{12}$ is driven by the controlling clock signal $CK_p$. In this signal input unit circuit 101, the other of the source/drain terminals of transistors $M_{04}$ serves as the output, $I_0$ , in the case of the circuit 101 itself. In contrast, gate of transistor $M_{11}$ is the feedback input $I_{FB_0}$ , in the case of circuit 101, from another circuit section (the feedback control and voltage output section 300) of the magnitude sorter, to he described in more detail below.

Mirroring MOS transistors $M_{03}$ and $M_{04}$, together with a switching MOS transistors $M_{12}$, establish a switching current mirror circuitry. Such a circuitry arrangement allows the current $I_0$ in the branch of MOS transistor $M_{04}$ to be tracing and maintaining that in the $M_{03}$ branch of the mirroring arrangement. Connected to the $M_{03}$ branch, the MOS transistor $M_{11}$, when switched on to conduct, allows the input current $I_{in_0}$ to be mirrored on the MOS transistor $M_{02}$. On the other hand, when the transistor $M_{11}$ is switched off, the current on the $M_{02}$ branch is reduced to virtually zero.

Thus, the corresponding relationship between the input current $I_{in_0}$ and the output current $I_0$ of the signal input unit circuit 101 can be manipulated via control of the conduction status of the switching MOS transistor $M_{11}$. Control of the conduction status of the switching MOS transistor $M_{11}$ is via a feedback signal $I_{FM_0}$ tied to the gate electrode of thereof, and the control will be described in the following paragraphs.

Still in FIG. 2, the maximum-deriving section 200 as exemplified for the magnitude sorter of the invention has four maximizing unit circuits in its array. Each of the maximizing unit circuits is an array of five MOS transistors. In the case of the maximizing unit circuit 201, there are the five transistors $M_{21}$, $M_{22}$, $M_{23}$, $M_{24}$ and $M_{25}$, with one of the source/drain terminals of these transistors tied to system ground, while the gate electrodes of all five are tied together and controlled by the output signal of the signal input unit circuit 101 of section 100. Each of the first four transistors $M_{21}$, $M_{22}$, $M_{23}$ and $M_{24}$ have the one source/drain terminal not tied to ground connected to the output of the corresponding signal input unit circuit in the signal input section 101. In the case of maximizing unit circuit 201, transistor $M_{21}$ has the particular source/drain terminal connected to output 10 of section 100. Similarly, the source/drain terminal of transistor $M_{22}$ is connected to 11 of section 100, and so on. Fifth transistor $M_{25}$ of the maximizing unit circuit 201, together with the corresponding counterpart in the other three unit circuits are tied together and employed as the output terminal to the sorted output section 400.

This entire section 200 is a so-called winner-takes all, WTA maximum-deriving circuit network. Within the network, all the NMOS transistors employed have substantially the same physical dimensions. In other words, they are of the same size when implemented as elements over the surface of the semiconductor wafer. This WTA circuit network is a kind of lateral suppression interfacing network capable of operating at high speed and turning out high precision results.

In this maximum-deriving circuit network of section 200, again, all four unit circuits have substantially the same circuit configuration. A description will be given to the unit circuit 201 outlined in the enclosing phantom line. Input of each of the unit circuits has its corresponding current mirror. For example, in the branch where input current $I_0$ flows, in other words, in the maximizing unit circuit 201, MOS transistor $M_{21}$ is the input transistor, ad a current flowing through the source-drain terminal of transistor $M_{21}$ will produce mirror current in between the source-drain terminals of transistors $M_{22}$, $M_{23}$, $M_{24}$ and $M_{25}$. However, drain terminals of transistors $M_{22}$, $M_{23}$ and $M_{24}$ are connected to the output currents $I_1$, $I_2$, and $I_3$ of the second, third and fourth signal input unit circuits in the signal input section 100 respectively.

Thus, assuming there is the situation that $I_0>I_1$, $I_0>I_2$ and $I_0>I_3$, all the currents flowing through the mirroring transistors $M_{22}$, $M_{23}$ and $M_{24}$ become smaller than the input current $I_0$ to the specific maximizing unit circuit 201. This in turn forces transistors $M_{22}$, $M_{23}$ and $M_{24}$ to operate in or in the vicinity of their respective non-saturated regions. In this case, nodes 2, 3 and 4 are suppressed at relatively low electric potentials, and the MOS transistors $M_{22}$, $M_{23}$ and $M_{24}$ corresponding to the currents $I_1$, $I_2$ and $I_3$ input thereto are then turned into the cut-off status. Output of the maximum-deriving section 200, in other words, output of the WTA network $I_{w_{out}}$ is the mirroring current flowing through the transistor $M_{25}$.

The above-exemplified situation wherein $I_0>I_1$, $I_0>I_2$ and $I_0>I_3$ is only one of the possible situations that may arise between the currents input to the maximizing unit circuits of the WTA network of section 200. Whatever the magnitude relationships among currents $I_0$, $I_1$ and $I_2$ input to the unit circuit 201, there are the mutual suppressive effects between the input currents depending on their mutual magnitude relationships. This results in a contention mechanism, in which the maximizing unit circuit having an input with the largest magnitude will attract currents to other inputs of the maximizing unit circuits in the array. This is because that the conduction resistance of mirror transistors in all maximizing unit circuits except the one with the input of largest magnitude is smaller.

Figure 3:
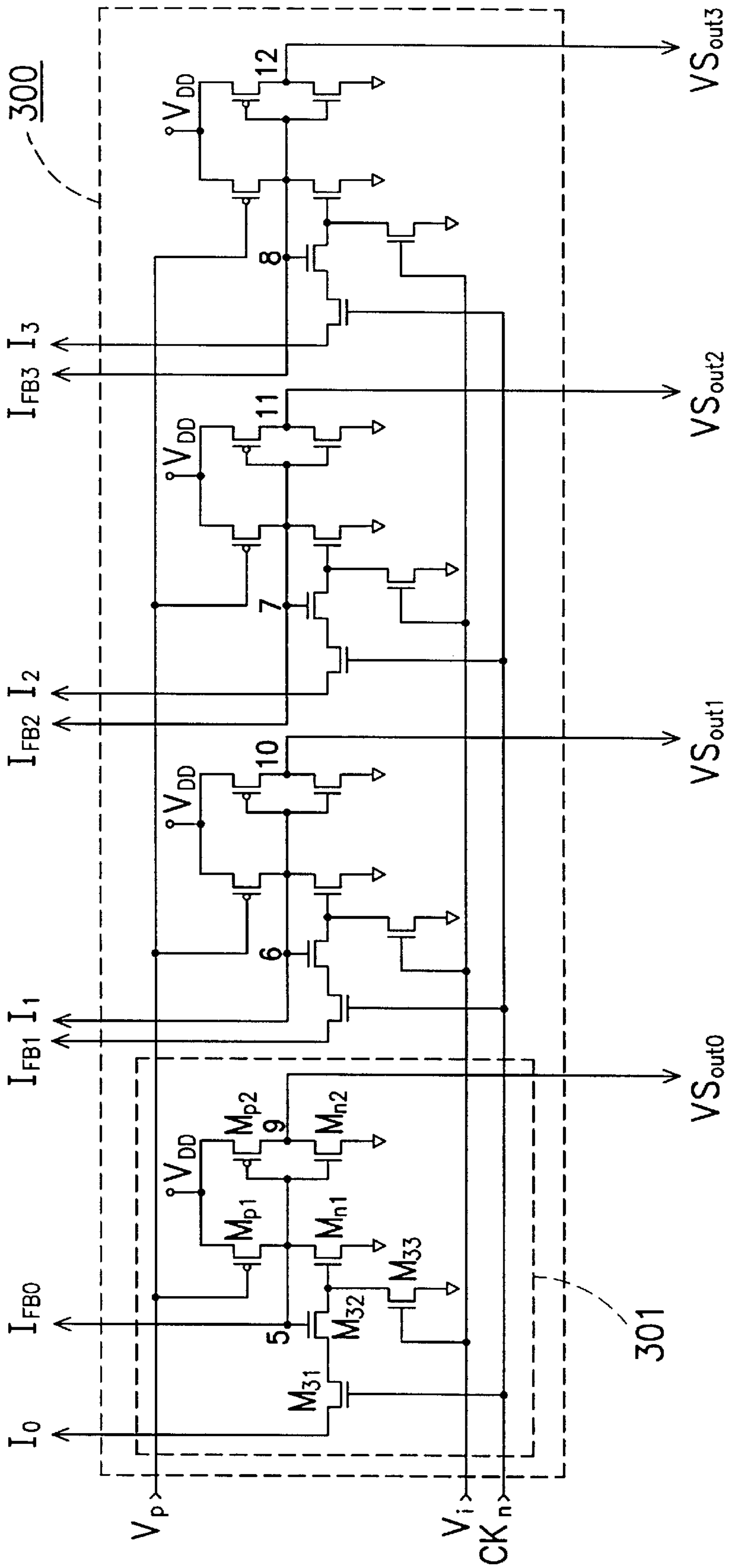
FIG. 3 is the schematic diagram showing that feedback control and voltage output section of the switched-current magnitude sorter of FIG. 1.

FIG. 3 is the schematic diagram showing the feedback control and voltage output section 300 of the switched-current magnitude sorter of FIG. 1. The four feedback control/voltage output unit circuits have the same circuit configuration in which only unit 301 will be described. In the feedback control/voltage output unit circuit 301, a MOS transistor $M_{31}$ is used to receive the output signal relayed from the corresponding signal input unit circuit, 101 in the case of feedback control/voltage output unit circuit 301, utilizing one of its source/drain terminals. Gate terminal of transistor $M_{31}$ is driven by a clock signal $CK_n$. The other source/drain terminal of transistor $M_{31}$ is connected to one of the source/drain terminals of another transistor $M_{33}$ across a transistor $M_{32}$ at the pair of source/drain terminals thereof. The other of the source/drain terminals of transistor $M_{33}$ is tied directly to system ground potential.

Gate electrode of transistor $M_{33}$ is driven by a voltage input Vi of the sorter. Meanwhile, gate electrode of transistor $M_{32}$, which is identified as node 5 in the drawing, is the output of the feedback control/voltage output unit circuit, circuit 301 in this case, that provides the feedback control signal to the corresponding signal input unit circuit, circuit 101 in this case.

The P- and NMOS transistors pairs, $M_{P_1}$ and $M_{n_1}$, and $M_{P_2}$ and $M_{n_2}$, are connected in series and by joining one of their respective source/drain terminals, and then tied between the ground and power supply potential of the system. The source/drain terminals of the four transistors that join the pairs are further connected to node 5, the feedback output of the unit circuit 301. The joining source/drain terminals of the pair of P- and NMOS transistors $M_{P_1}$ and $M_{n_2}$ is employed as the voltage output node of the feedback control/voltage output unit circuit, circuit 301 in this case. Gate electrode of the PMOS transistor $M_{P_1}$ is driven by the input voltage $V_p$.

In the feedback control/voltage output unit circuit 301, switching transistors $M_{31}$ and $M_{32}$ are used to determine the one and off status of the pre- and post circuitries. Switching transistor $M_{33}$, on the other hand, is used to establish the initial status of the magnitude sorter. NMOS transistors $M_{P_1}$ and $M_{n_2}$ together with PMOS transistors $M_{P_1}$ and $M_{P_1}$ make up a non-linear conversion circuit. In the conversion circuit, $M_{n_2}$ is the mirror transistor of $M_{21}$ in the WTA network. Together, $M_{n_2}$, $M_{21}$ and switching transistors $M_{31}$ and $M_{32}$ form a switching current mirror.

Transistor $M_{P1}$ controlled by the externally applied bias voltage $V_p$ functions to pull up the electrical potential level at the drain terminal of the transistor $M_{n_1}$, Meanwhile, N- and PMOS transistors $M_{n_2}$ and $M_{P_2}$ make up an inverter. The non-linear conversion circuit converts the gate voltage of transistor $M_n$ that is smaller or larger than a predetermined threshold value into a relatively low or high electric potential respectively, and the converted voltage signal is then output as voltage output $VS_{out_1}$, at node 9.

The externally-applied bias voltage signal $V_P$ can be used to adjust the value of the predetermined threshold. In the array of unit circuits in section 300, voltages at circuit nodes 5, 6, 7 and 8, which are the feedback signal $I_{FB_0}$, $I_{FB_1}$, $I_{FB_2}$ and $I_{FB_3}$ that are relayed back to the signal input unit circuits in section 100 of FIG. 2, are used to control the on and off status of the respective transistors connected thereto. They are connected to the gate terminals of the MOS transistor in the signal input unit circuit of section 100, i.e., transistor $M_{11}$ in the case of the exemplified embodiment of FIG. 2, as can be seen in the drawing.

Thus, circuit nodes 9, 10, 11 and 12, which are the voltage outputs $VS_{out_0}$, $VS_{out_1}$, $VS_{out_2}$, and $VS_{out_3}$, respectively, produce voltage outputs that are arranged in a sorted manner in the ascending direction. These sorted voltage outputs can then be used to ensure that currents sorted in the descending direction can be corresponding to their respective input conditions.

Figure 4:
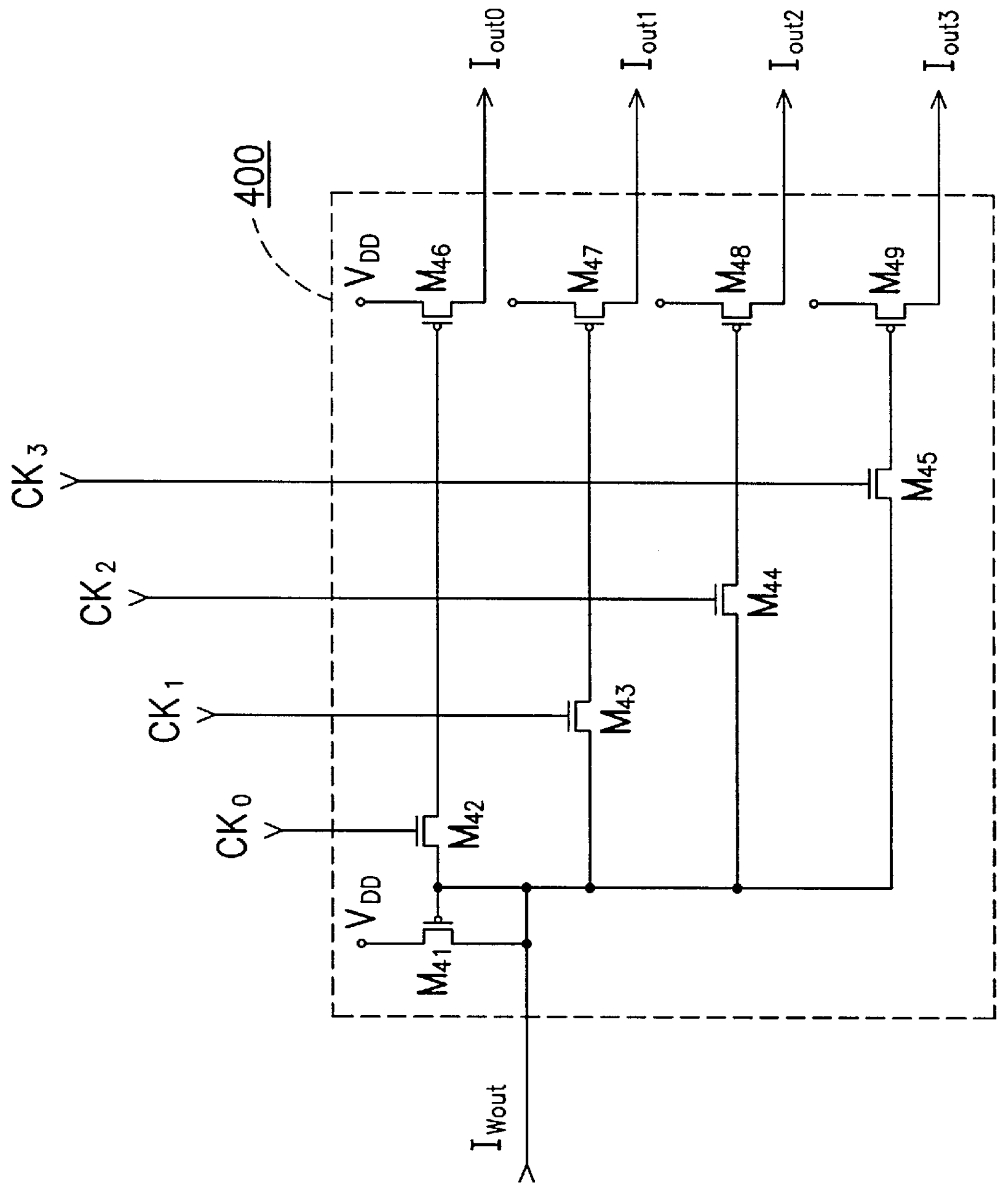
FIG. 4 is the schematic diagram showing the sorted output section of the switched-current magnitude sorter of FIG. 1.

FIG. 4 is the schematic diagram showing the sorted output section 400 of the switched-current magnitude sorter of FIG. 1. The sorted output section of the magnitude sorter as depicted in the illustrated embodiment of the invention has four MOS transistors $M_{42}$, $M_{43}$, $M_{44}$ and $M_{45}$ having one of the source/drain terminals thereof connected together and further to both the gate electrode and one of the source/drain terminal of another transistor $M_{41}$. This common connection node is also the input $I_{w_{out}}$, for the section 400 that receives the output signal of the feedback control and voltage output section 300. The other source/drain terminal of transistor $M_{41}$ is tied directly to system power supply potential.

Gate electrodes of transistors $M_{42}$, $M_{43}$, $M_{44}$ and $M_{45}$ are each driven by a corresponding clock signal, namely clocks $CK_0$, $CK_1$, $CK_2$ and $CK_3$ respectively. The other of the two source/drain terminals of transistors $M_{42}$, $M_{43}$, $M_{44}$and $M_{45}$ are each connected to the gate electrode of a corresponding transistor $M_{46}$, $M_{47}$, $M_{48}$ and $M_{49}$ respectively. One of the two source/drain terminals of transistor $M_{46}$, $M_{47}$, $M_{48}$ and $M_{49}$ are each connected to the system power supply $V_{DD}$, while the other is utilized as the sorted output of the section 400.

In the circuit section 400, NMOS transistor $M_{42}$, $M_{43}$, $M_{44}$ and $M_{45}$ are switching transistors controlled by non-overlapping clock signals $CK_0$, $CK_1$, $CK_2$ and $CK_3$ respectively PMOS transistors $M_{46}$, $M_{47}$, $M_{48}$ and $M_{49}$ are mirror transistors having the same physical dimension as that of transistor $M_{41}$. The current $I_{w_{out}}$ output by the WTA network of the maximum-deriving section 200 may be mirror-mapped to each of the output ends in order to produce sorted output currents $I_{out_0}$, $I_{out_1}$, $I_{out_2}$, and $I_{out_3}$. These outputs $I_{out_0}$, $I_{out_1}$, $I_{out_2}$, and $I_{out_3}$are sorted in the ascending direction.

Figure 5:
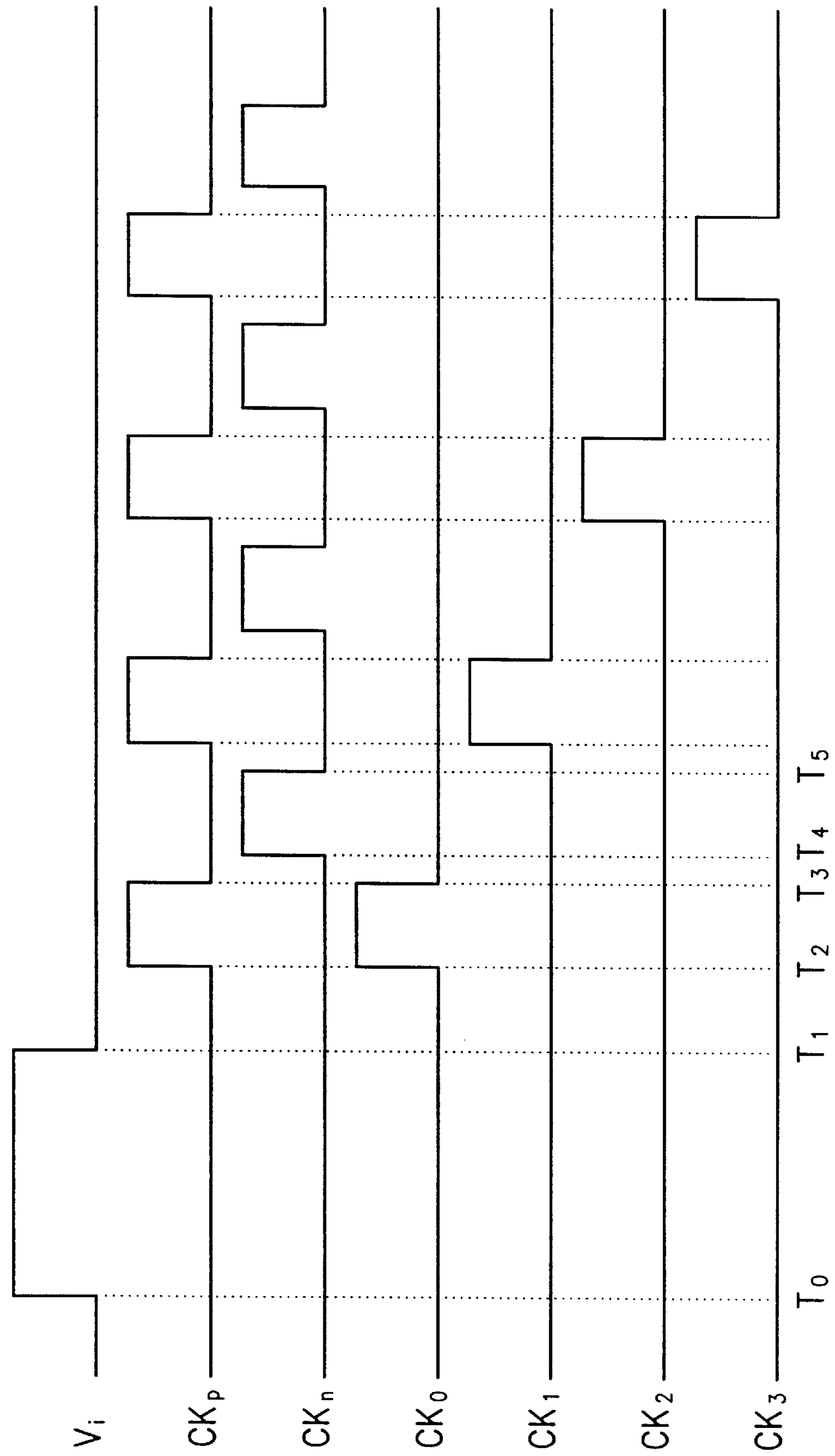
FIG. 5 is a time diagram showing timing relationship between the clock signals for constituent sections of the switched-current magnitude sorter of FIG. 1.

The following paragraphs describe in more detail he operation principle of the four-input magnitude sorter as outlined in FIGS. 2, 3, and 4 based on the time diagram of the controlling clock signals that governs the sorter operation. Note that FIG. 5 exhibits the various controlling clock signals in a timing diagram for the constituent sections of the magnitude sorter outlined in the block diagram of FIG. 1 of the accompanying drawings. Specifically, in a preferred embodiment of the invention such as the four-input magnitude sorter having the four circuit sections 100, 200, 300 and 400 as illustrated in FIGS 2, 3 and 4, these controlling clock signals include $CK_p$, a clock for the signal input section 100, $CK_n$, a clock for the feedback control and voltage output section 300, and $CK_0$, $CK_1$, $CK_2$ and $CK_3$, a total of four clocks for the sorted output section 400. When the magnitude sorter is not operating, all these controlling clock signals may be intentionally pulled to the ground electric potential, so as to reduce the sorter power consumption level at idle.

When, however, the magnitude sorter operation is started to sort the input signals, the clock signals $CK_p$, $CK_n$, and $CK_0$, $CK_1$, $CK_2$and $CK_3$ can then be initiated at, for example, time $T_0$, as is indicated by a vertical phantom line along the time axis not explicitly shown. At initialization time $T_0$, the voltage input $V_i$ to the array of feedback control/voltage output unit circuits in section 300 is raised to its high signal status. As can be observed in FIG 3, this forces the gate voltage of all the MOS transistors in each of the unit circuits in the array corresponding to $M_n$ in unit circuit 301 to be brought to ground electric potential.

As a result, nodes 5, 6, 7 and 8, which are the output nodes of the feedback control current signals $I_{FB_0}$, $I_{FB_1}$, $I_{FB_2}$ and $I_{FB_3}$ that to be relayed back to the signal input unit circuits in section 100 for feedback control, become high electric potential. On the other hand, nodes 9, 10, 11 an 12, which being the output nodes of the voltage outputs $VS_{out_0}$, $VS_{out_1}$, $VS_{out_2}$, and $VS_{out_3}$ respectively are also brought to ground electric potential since $M_{n_2}$ and its corresponding counterparts in the array conduct as a result of high electric potential applied at its gate electrode.

High electric potential at nodes 5, 6, 7 and 8, in other words, high electric potential feedback signals $I_{FB_0}$, $I_{FB_1}$, $I_{FB_2}$, and $I_{FB_3}$, brings the switching MOS transistor $M_{11}$ and its corresponding counterparts in the unit circuit array of the signal input section 100 into conduction state. Meanwhile, switching MOS transistor $M_{32}$ and its corresponding counterparts in the feedback control/voltage output unit circuits in the array of section 300 in FIG. 3 are also brought into the conduction state. Then, at time $T_1$, when the input signal $V_i$ to the feedback control/voltage output unit circuits of section 300 are lowered to ground electric potential, nodes 5, 6, 7 and 8 become high electric potential, while nodes 9, 10, 11 and 12 turned into low electric potential.

At time $T_2$, the first positive pulse for clock $CK_p$ is issued as the rising edge arrives. The switching MOS transistor $M_{12}$ and its corresponding counterparts in the signal input unit circuits in the array of section 100 in FIG. 2 are turned on to conduct. This causes the mirroring of the input currents flow at the input terminal of the WTA network. Assuming the condition $I_{m_0}$ -max($I_{in_0}$, $I_{in_1}$, $I_{in_2}$, $I_{in_3}$), the WTA network obtains the maximum current based on the lateral suppression effect, namely, there is $I_{w_{out}}=I_{in_0}$. Meanwhile the voltage at node 1 is brought to high, while at nodes 2, 3 and 4 to low.

At time $T_2$, clock $CK_0$ issues its positive clock pulse having the same rising edge as that of clock $CK_p$, and this forces transistor $M_{42}$ in the sorted output section 400 to conduct, and the current with the largest measured magnitude is then output by mirror mapping. Thus, there is established $I_{out_0}=I_{in_0}$.

Then, at time $T_3$, falling edges bring down both clock signals $CK_p$ and $CK_0$. Output currents of the switching current mirrors in both the signal input section 100 and the sorted output section 400 are sustained, therefore, there is $I_{out_0}=I_{in_0}$. Then, when the positive pulse of clock $CK_n$ arrives at time $T_4$, the transistor $M_{31}$ and its corresponding counterparts in the feedback control/voltage output unit circuits of section 300 are turned on to conduct. The high voltage at node 1, namely current $I_0$ in the first signal input unit circuit of FIG. 2, forces the voltage at node 5, namely the feedback current $I_{FB_0}$, to become low. Meanwhile, the low voltages at nodes 2, 3 and 4, namely currents $I_2$, $I_3$and $I_4$ in the other three signal input unit circuits of section 100, force voltages at nodes 6, 7 and 8, namely the corresponding feedback current signal $I_{FB_1}$, $I_{FB_2}$, and $I_{FB_3}$, to be maintained at high potential. The direct consequence of such a situation is that voltage output $VS_{out_0}$ of the first feedback control/voltage output unit circuit 301 in the array of section 300 turns out a positive pulse signal, while the voltages of the other outputs $VS_{out_1}$, $VS_{out_2}$ and $VS_{out_3}$ in the array are still maintained at low potential. Therefore, by examining into the stepped output $VS_{out_1}$, the input terminal that corresponds to the current signal with the largest magnitude can thus be determined.

On the other hand, the low voltage at gate electrode of the switching transistor $M_{32}$ turns off the transistor itself, and this forces node 5 (i.e., $I_{FB_0}$) constantly at low electric potential. At the same time, low voltage at node 5 turns off the switching transistor $M_{11}$ in the signal input unit circuit 101 of section 100, and this forces the mirrored output current of $I_{in_0}$ into zero, i.e., the current in the branch of transistor $M_{03}$ is zero all the time. Then, when the second clock signal $CK_p$ arises after time $T_5$, the becomes zero, and the input current $I_{in_1}$ does not interfere with the sorting of the order input currents $I_{in_1}$, $I_{in_2}$ and $I_{in_3}$ in the other signal input unit circuits.

The above-described operation principle also true for the other input currents $I_{in_1}$, $I_{in_2}$, and $I_{in_3}$ in the other signal input unit circuits other than 101 examined with reference to the drawings. Among the three remaining input currents, the one with largest magnitude is then sorted and output at the $I_{out_1}$ terminal of the sorted output section 400. Meanwhile, in the feedback control and voltage output section 300, the positively-pulsed voltage input is output at the corresponding second-largest output, namely, $VS_{out_1}$.

In this manner, after the sorting operation concludes for all four inputs, the sorted output section 400 will have all four arranged in the outputs sorted in the order of $I_{out_0}>I_{out_1}>I_{out_2}>I_{out_3}$. As can be observed in the schematic diagram of FIG. 4 this sorted results is driven for output by the four clock control signals $CK_0$, $CK_1$, $CK_2$ and $CK_3$ in a time-sharing scheme, which is also obvious based on the time diagram of FIG. 5.

At the same time, the feedback control and voltage output section 300 also has its four voltage outputs $VS_{out_0}$, $VS_{out_1}$, $VS_{out_2}$ and $VS_{out_3}$ respectively arranged in the sorted descending order. The voltage outputs of the feedback control and voltage output section 300 are also implemented in a time-sharing scheme in the form of positive-going stepped up signals that each steps from the ground potential to some positive value. This output scheme can be controlled by the issue of the clock signal $CK_{n_1}$ as in the depicted timing sequence of FIG. 5. Based on testing to these voltage outputs terminals $VS_{out_0}$, $VS_{out_1}$, $VS_{out_2}$ and $VS_{out_3}$, the relationship of correspondence among the four input signals $I_{in_1}$ (where i=0, 1, 2 and 3) at the signal input section 100 and the voltage outputs $VS_{out_1}$ (where j=0, 1, 2 and 3) at the feedback control and voltage output section 300.

Figure 6:
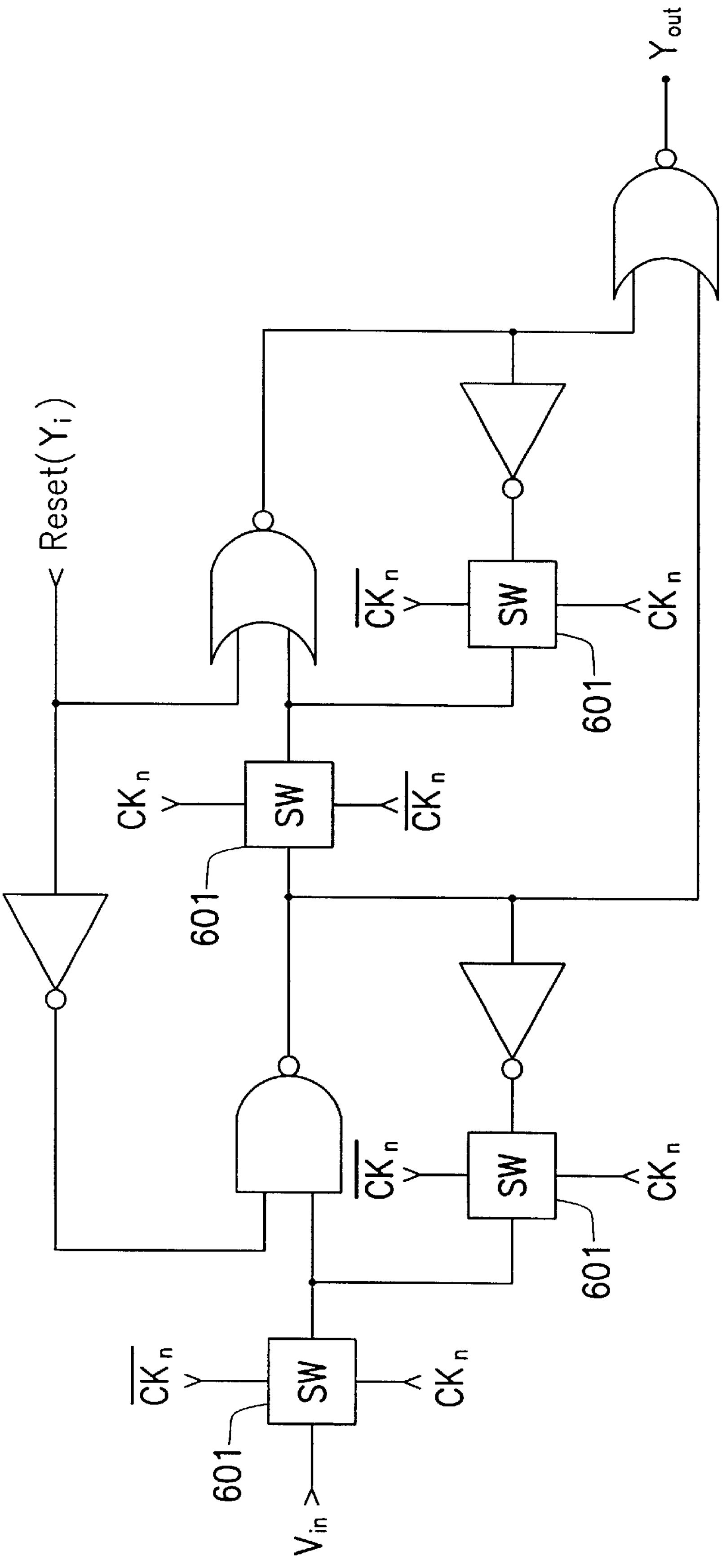
FIG. 6 is a schematic diagram of a preferred embodiment of the testing circuit that can be employed to determine the correspondence relationship between the input signals to and the voltage outputs of the magnitude sorter.

As a means to implement the testing to examine the voltage outputs at the feedback control and voltage output section 300, a step signal testing circuit is outlined in FIG. 6 in a schematic diagram. FIG. 6 illustrates a preferred embodiment of the testing circuit that can be employed to determine the relationship of correspondence among the input signals to and the voltage outputs of the inventive magnitude sorter. In the testing circuit of FIG. 6 four CMOS simulating switches 601 are employed, with $\overline{CK_n}$ being the inverse version of the clock signal $CK_2$. A reset signal RESET($V_i$) is used to restore the $V_i$ input signal. The purpose of the testing circuit outline in FIG. 6 is to convert a step input signal that goes from low to high into a positively-pulsed signal for output at the $V_{out}$ terminal.

Thus, the magnitude sorter of the invention as exemplified in the preferred embodiment described above is capable not only of sorting a number of input signals in terms of signal magnitude. The relationship of correspondence between the input signals and the sorted output terminals can also be determined based on testing and examination of the sorted voltage output. Such relationship correspondence of input signals and sorted output terminal assignment can be very important for post processing requirements for signal analysis as well as manipulation. All these can be achieved based on relatively very simple electronic circuitry. The sorted output can also be arranged in a very flexible manner, employing the simple control of clock signals. For example, with a subsequent rain of clock signals, the sorted output can be brought out over the data bus in a time-shared manner.

Or, in the case of the discussed embodiment, if only clock signal $CK_0$ is used, the entire circuitry can be reduced and used as a maximum-deriving logic. On the other hand. Of $CK_3$ is sued, it is then a minimum-deriving logic. Although the discussed embodiment had shown a magnitude sorter with circuitry processing a total of four input signals, however, one that can process and sort more or less signals is equally possible.

The switched current magnitude sorter of the invention is compatible with the digital integrated circuit device fabrication technologies, and can be easily implemented as IC devices that can be used to sort a number of signals in terms of the magnitudes thereof. Based on the depicted embodiment as outlined in the block diagram and the detailed schematic diagrams, such a sorter device can be implemented in, for example, CMOS fabrication process.

While the invention has been described by way of example and in terms of preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A magnitude sorter circuit apparatus for sorting to output a plurality of input signals into an ascending or descending ordered manner based on the magnitudes of the input signals, comprising:

a signal input section, including a plurality of signal input unit circuits, each of the signal input unit circuits having an input for receiving a corresponding one of the input signals and generating an output signal, and further having a feedback input for receiving a feedback signal; and each of the signal input unit circuits is driven by a first clock control signal;

a maximum-deriving section, including a plurality of maximizing unit circuits, each of the maximizing unit circuits receiving the output signal output by the corresponding signal input unit circuit, and generating an output signal that is connected together with those generated by other maximizing unit circuits to form the maximized output of the maximum-deriving section;

a feedback control and voltage output section, including a plurality of feedback control/voltage output unit circuits, each of the feedback control/voltage output unit circuits receiving the output signal output by the corresponding signal input unit circuit, and generating a feedback control signal for feedback into the feedback input of the corresponding signal input unit circuit, and each of the feedback control/voltage output unit circuits is driven by a second clock control signal, and each having a first and second input voltage signals; and a sorted output section, having a plurality of sorted outputs, and input for receiving the maximized output of the maximum-deriving section and a plurality of timing clock inputs each receiving a corresponding one of a plurality of timing clock control signals, and the sorted output section generates the sorted output signals at the plurality of sorted outputs in the sorted ascending or descending ordered manner controlled by the timing clock control signals.

2. The magnitude sorter circuit apparatus according to claim 1, wherein each of the plurality of signal input unit circuits of the signal input section further comprises:

a first MOS transistor having the first source/drain terminal thereof connected to ground potential of the magnitude sorter circuit apparatus, and the second source/drain terminal receiving the corresponding one of the plurality of input signals and further connected to the gate terminal thereof, a second MOS transistor having the first source/drain terminal thereof connected to the ground potential, and the gate terminal connected to the gate terminal of the first MOS transistor;

a third MOS transistor having the first source/drain terminal thereof connected to the power supply potential of the magnitude sorter circuit apparatus, and the second source/drain terminal connected to the gate terminal thereof;

a fourth MOS transistor having the first source/drain terminal thereof connected to the power supply potential, and the second source/drain terminal generating the output of the signal input unit circuit, a fifth MOS transistor having the first source/drain terminal thereof connected to the gate terminal of the third MOS transistor, the second source/drain terminal connected to the second source/drain terminal of the second MOS transistor, and the gate terminal receiving the feedback signal from the feedback control and voltage output section; and a sixth MOS transistor having the first source/drain terminal thereof connected to the gate terminal of the third MOS transistor and the second source/drain terminal connected to the gate terminal of the fourth MOS transistor, and the gate terminal driven by the first clock control signal.

3. The magnitude sorter circuit apparatus according to claim 1, wherein each of the plurality of maximizing unit circuits of the maximum-deriving section further comprises:

a first MOS transistor having the gate and one of the source/drain terminal thereof connected to the output signal generated by the corresponding signal input unit circuit in the signal input section, and the other of the source/drain terminals thereof connected to the ground potential.

a second MOS transistor having gate thereof connected to the output signal generated by the corresponding signal input unit circuit in the signal input section, one of the source/drain terminals thereof connected to the output of the maximum-deriving section, and the other of the source/drain terminals thereof connected to the ground potential, and a plurality of MOS transistors having gates thereof connected together and receiving the output signal generated by the corresponding signal input unit circuit in the signal input section, one of the source/drain terminals thereof connected to the ground potential, and the other of the source/drain terminals of each of the plurality of MOS transistors being connected to the output signal generated by one corresponding signal input unit circuit in the signal input section other than the one corresponding to the one having the signal output driving the gates of all the MOS transistors of the maximizing unit circuit itself.

4. The magnitude sorter circuit apparatus according to claim 1, wherein each of the plurality of feedback control/voltage output unit circuits of the feedback control and voltage output section further comprises:

a first MOS transistor having the first source/drain terminal thereof connected to the output signal generated by the corresponding signal input unit circuit in the signal input section, and the gate thereof connected to receive the second clock control signal;

a signal MOS transistor having the first source/drain terminal thereof connected to the second of the source/drain terminals of the first MOS transistor;

a third MOS transistor having the first source/drain terminal thereof connected to the second of the source/drain terminals of the second MOS transistor, the second of the source/drain terminals thereof connected to the ground potential, and the gate thereof connected to receive the first input voltage signal;

a first PMOS transistor having the gate thereof connected to receive the second input voltage signal, the first of the source/drain terminals thereof connected to the power potential, and the second of the source/drain terminals thereof connected to the gate of the second MOST transistor for outputting the feedback signal to the corresponding signal input unit circuit in the signal input section;

a second PMOS transistor having the gate thereof connected to the second of the source/drain terminal of the first PMOS transistor, and the first of the source/drain terminals thereof connected to the power potential;

a first NMOS transistor having the gate thereof connected to the first of the source/drain terminals of the third MOS transistor, the first of the source/drain terminals thereof connected to the gate of the second PMOS transistor, and the second of the source/drain terminals thereof connected to the ground potential; and a second NMOS transistor having the gate thereof connected to the gate of the second PMOS transistor, the first of the source/drain terminals thereof connected to the ground potential, and the second of the source/drain terminals thereof connected to the second of the source/drain terminals of the second PMOS transistor for generating a voltage output signal.

5. The magnitude sorter circuit apparatus according to claim 1, wherein the sorted output second further comprises:

an input MOS transistor having the gate and the first of the source/drain terminals thereof connected together to receive the maximized output of the maximum-deriving section, and the second of the source/drain terminals thereof connected to power potential;

a plurality of MOS transistor pairs, each of the pairs comprises a first MOS transistor having the gate thereof connected to receive the corresponding one of the timing clock control signals, and the first of the source/drain terminals thereof connected to receive the maximized output of the maximum-deriving sections, and the second of the source/drain terminals connected to the gate of the second of the MOS transistor in the pair, the first of the source/drain terminals of the second MOS transistor being connected to the power potential, and the second of the source/drain terminals thereof generates the corresponding sorted output signal.

* * * * *